United States Patent
Bull et al.

(10) Patent No.: US 6,172,530 B1
(45) Date of Patent: Jan. 9, 2001

(54) DECODER FOR GENERATING N OUTPUT SIGNALS FROM TWO OR MORE PRECHARGED INPUT SIGNALS

(75) Inventors: David Michael Bull, Balsham; Andrew Christopher Rose, Cherry Hinton, both of (GB)

(73) Assignee: Arm Limited, Cambridge (GB)

( * ) Notice: Under 35 U.S.C. 154(b), the term of this patent shall be extended for 0 days.

(21) Appl. No.: 09/335,696

(22) Filed: Jun. 18, 1999

(51) Int. Cl.$^7$ .................................................. G11C 8/00
(52) U.S. Cl. ............................................ 326/105; 365/203
(58) Field of Search ................... 365/230.06, 203; 326/106, 105

(56) References Cited

U.S. PATENT DOCUMENTS

| | | | |
|---|---|---|---|
| 4,926,387 | * 5/1990 | Madland | 365/233 |
| 5,369,621 | * 11/1994 | Mason | 365/230.06 |
| 5,802,541 | * 9/1998 | Reed | 711/1 |

\* cited by examiner

Primary Examiner—David Nelms
Assistant Examiner—M. Tran
(74) Attorney, Agent, or Firm—Nixon & Vanderhye P.C.

(57) ABSTRACT

A decoder is provided for generating N output signals, the decoder comprising a precharged gate structure arranged to receive two or more input signals and to generate N intermediate signals. In a precharge phase, the precharged gate structure is arranged to output the N intermediate signals at a first logic value, and in an evaluate phase the precharged gate structure is arranged to maintain a first intermediate signal at the first logic value, and to cause all other intermediate signals to transition to a second logic value. Further, self-timed logic is provided for receiving the N intermediate signals, and for generating the N output signals, the self-timed logic being arranged, during the precharge phase, to generate the N output signals at the second logic value, and during the evaluate phase to cause a first output signal corresponding to the first intermediate signal to transition to the first logic value. The self-timed logic is further arranged to generate each output signal from the corresponding intermediate signal as qualified to predetermined other intermediate signal, such that the transition of the first output signal to the first logic value is delayed by a first predetermined time after the predetermined other intermediate signal has transitioned to the second logic value.

8 Claims, 4 Drawing Sheets

DECODER FOR GENERATING N OUTPUT SIGNALS FROM TWO OR MORE PRECHARGED INPUT SIGNALS

BACKGROUND OF THE INVENTION

1. Field of the Invention

The present invention relates to a decoder arranged to generate N output signals from two or more precharged input signals.

2. Description of the Prior Art

It is often necessary to provide decoder circuits for producing a number of output signals based on two or more precharged input signals. The output signals generated by the decoder circuit may, for example, be used as input signals to domino logic. During the precharge phase, it is typically required that all of the output signals from the decoder are at the same logic value, and that during the subsequent evaluate phase, one of the output signals transitions to another logic value. For example, if a decoder circuit is to produce outputs suitable for use with a CMOS domino logic wired NOR gate, then the required behaviour is that during the precharge phase all of the outputs of the decoder are at a logic 0 level, and that during the subsequent evaluate phase exactly one output makes a single transition from a logic zero to a logic 1 value. It is also necessary to ensure that all of the output signals from the decoder circuit are valid after the single transition of one of the outputs has taken place.

For decoder circuits using precharged inputs, the above behaviour is that of a decoder implemented using an AND gate structure to produce the outputs. Considering the example of an N bit encoded input, this requires an N-input AND gate per output. An N-input AND gate requires either an N stack of n-type transistors, or an equivalent cascade of AND gates in series. However, as the number of inputs increases, an AND based decoder circuit becomes slower with the increased number of stacked or cascaded devices.

Accordingly, it is an object of the present invention to provide an improved decoder which during the precharge phase produces all of the outputs at the same logic value, and during a subsequent evaluate phase causes one of the output signals to make a transition to another logic value, whilst ensuring that all of the output signals are valid once that output signal has transitioned.

SUMMARY OF THE INVENTION

Accordingly, the present invention provides a decoder for generating N output signals, the decoder comprising: a precharged gate structure arranged to receive two or more input signals and to generate N intermediate signals, in a precharge phase said precharged gate structure being arranged to output said N intermediate signals at a first logic value, and in an evaluate phase said precharged gate structure being arranged to maintain a first intermediate signal at said first logic value, and to cause all other intermediate signals to transition to a second logic value; self-timed logic for receiving the N intermediate signals, and for generating said N output signals, the self-timed logic being arranged, during said precharge phase, to generate said N output signals at said second logic value, and during the evaluate phase to cause a first output signal corresponding to said first intermediate signal to transition to said first logic value; said self-timed logic being arranged to generate each output signal from the corresponding intermediate signal as qualified by a predetermined other intermediate signal, such that the transition of said first output signal to said first logic value is delayed by a first predetermined time after the predetermined other intermediate signal has transitioned to said second logic value.

In accordance with the present invention, the decoder includes a precharged gate structure which in the precharge phase is arranged to output N intermediate signals at a first logic value, and in an evaluate phase is then arranged to maintain a first intermediate signal at the first logic value, and to cause all other intermediate signals to transition to a second logic value. It will be appreciated that the behaviour of these intermediate signals is not the behaviour that is ultimately required of the output signals of the decoder, but it has been found that by allowing the precharged gate structure to produce such intermediate signals, it is possible for a more efficient precharged gate structure to be used in the decoder than would otherwise be possible if the precharged gate structure were to directly produce the desired output signals.

For example, with reference to the earlier described prior art decoder based on AND gates, it is now possible for the precharged gate structure to be constructed using NOR gates rather than AND gates. This is beneficial for large structures since an alternative way of implementing an AND function is to use the fact that:

X AND Y==NOT (NOT X OR NOT Y)

this relationship being known as the De Morgans equation. An N input OR gate can be implemented as a precharged NOR gate, followed by an inverter. Accordingly, the above equation yields:

X AND Y==(NOT X) NOR (NOT Y)

The precharged NOR gate structure contains n-type transistors connected in parallel, and for large structures a precharged NOR gate is generally faster than a precharged AND gate.

However, with reference to the earlier discussions concerning the required behaviour for the decoder circuit, it is apparent that the outputs of a decoder circuit constructed using precharged NOR gates do not have the required behaviour for use with domino logic. Typically, for a precharged NOR gate structure, during the precharge phase, all of the outputs will be at a first logic value, and during the evaluation phase all but one output will make a transition from that first logic value to a second logic value. Hence, considering the earlier example, where the decoder circuit is to be used to provide input signals for a CMOS domino logic, at the start of the evaluation phase, all of the outputs will be at a logic 1 level, and during the evaluation stage, all but one output will make a single transition from logic 1 to logic 0.

However, in accordance with the present invention, the decoder also comprises self-timed logic which is arranged to manipulate the intermediate signals to produces the desired output signals, and also to ensure that all of the output signals are valid once one of the output signals has transitioned. Accordingly, the self-timed logic is arranged to receive the N intermediate signals, and during said precharge phase to generate N output signals at a second logic value. Then, during the evaluate phase, the self-timed logic is arranged to cause a first output signal corresponding to the first intermediate signal to transition to the first logic value. Further, the self-timing of the output signal is achieved by arranging the self-timed logic to generate each output signal from the corresponding intermediate signal as qualified by a predetermined other intermediate signal, such that the transition of the first output signal to the first logic value is delayed by a first predetermined time after the predetermined other intermediate signal has transitioned to the second logic value. By this approach, it is ensured that by the time the first output signal has transitioned to the first logic value, all of the other output signals will be valid.

In preferred embodiments, the self-timed logic comprises a logical AND gate for each intermediate signal, each logical AND gate being arranged to receive the corresponding intermediate signal and a second signal derived by inverting the predetermined other intermediate signal. Further, the self-timed logic preferably comprises an inverter associated with each AND gate, the inverter being arranged to receive at its input the predetermined other intermediate signal, and to generate at its output the second signal for inputting to the associated AND gate.

With the above preferred embodiment approach, it is possible to apply the delay in the transitioning of the first output signal to the first logic value by appropriate selection of the logic elements within the self-timed logic. More particularly, in preferred embodiments, the inverter is arranged to take said first predetermined time to generate the second signal from the predetermined other intermediate signal received at its input.

As mentioned earlier, the provision of a decoder in accordance with the present invention enables more efficient precharged gate structures to be used than the typical prior art AND gate structure. In preferred embodiments, the precharged gate structure comprises a plurality of logical NOR gates. More particularly, in preferred embodiments, the precharged gate structure comprises N logical NOR gates, one logical NOR gate being associated with each intermediate signal to be generated by the precharged gate structure.

In preferred embodiments, in the evaluate phase, the precharged gate structure is arranged to receive a first input signal comprising an encoded N-bit value, and a second input signal comprising the complement of the first input signal, selected bits of the first and second input signals being provided to the plurality of logical NOR gates in order to generate said N intermediate signals.

Preferably the logical NOR gates are grouped in pairs, and the logical NOR gates in each pair are arranged so that the maximum time difference between the intermediate signals generated by each logical NOR gate transitioning from said first logic value to said second logic value is a second predetermined time, the first predetermined time being at least as long as the second predetermined time. The reasoning for this approach is best illustrated with reference to an example. Hence, consider the example where the first logic value is a logic 1 value, and the second logic value is a logic 0 value. In the precharge phase, all of the intermediate signals are at a logic 1 value, and then during the evaluate phase, all but one of the signals will transition to the logic 0 value. Accordingly, it is apparent that an intermediate signal remaining at a logic 1 value can be considered to be valid once the intermediate signal generated by the other logical NOR gate in the pair has transitioned to a logic 0 value, and the second predetermined time has then elapsed. In accordance with the present invention, this second predetermined time period is factored into the delay incorporated by the self-timed logic, and typically this delay, i.e. the first predetermined time period, is chosen to be equal to the second predetermined time, plus a small extra period to act as a safety margin.

Viewed from a second aspect the present invention a method of generating N output signals from two or more input signals, the method comprising the steps of: (i) inputting the two or more input signals to a precharged gate structure; (ii) arranging the precharged gate structure to generate N intermediate signals, in a precharge phase said precharged gate structure outputting said N intermediate signals at a first logic value, and in an evaluate phase said precharged gate structure maintaining a first intermediate signal at said first logic value, and causing all other intermediate signals to transition to a second logic value; (iii) passing the N intermediate signals to self-timed logic arranged to generate said N output signals; (iv) arranging the self-timed logic to generate, during said precharge phase, said N output signals at said second logic value, and during said evaluate phase to cause a first output signal corresponding to said first intermediate signal to transition to said first logic value; said self-timed logic being arranged to generate each output signal from the corresponding intermediate signal as qualified by a predetermined other intermediate signal, such that the transition of said first output signal to said first logic value is delayed by a first predetermined time after the predetermined other intermediate signal has transitioned to said second logic value.

BRIEF DESCRIPTION OF THE DRAWINGS

The present invention will be described further, by way of example only, with reference to a preferred embodiment thereof as illustrated in the accompanying drawings, in which.

DESCRIPTION OF A PREFERRED EMBODIMENT

Figure 1:
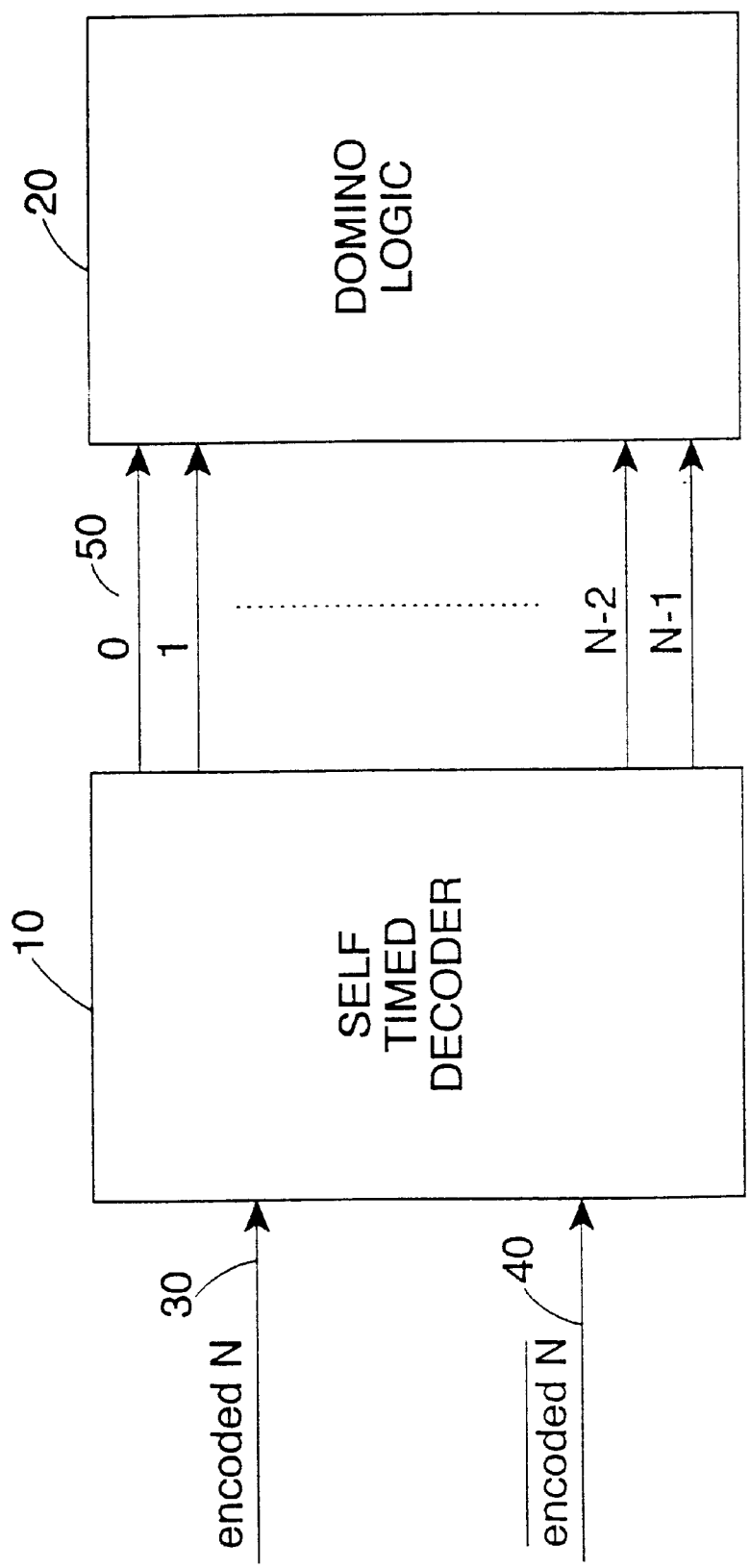
FIG. 1 illustrates how a self-timed decoder in accordance with preferred embodiments of the present invention may be used to generate N output signals for use by domino logic in dependence on two input signals.

FIG. 1 illustrates a self-timed decoder 10 in accordance with preferred embodiments of the present invention, which is arranged to receive as its input an encoded N bit value over path 30, and the complement of the encoded N-bit value over path 40. Based on these two input values, the decoder 10 is arranged to produce N output signals over path 50 for use as inputs to domino logic 20. Although the self-timed decoder 10 is preferably used to generate input signals for domino logic, it will be appreciated that it may used to generate signals for other circuitry, for example to generate signals used for word-line selection for a Random Access Memory (RAM). Further details of the self-timed decoder 10 in accordance with preferred embodiments will now be discussed with reference to FIG. 2.

Figure 2:
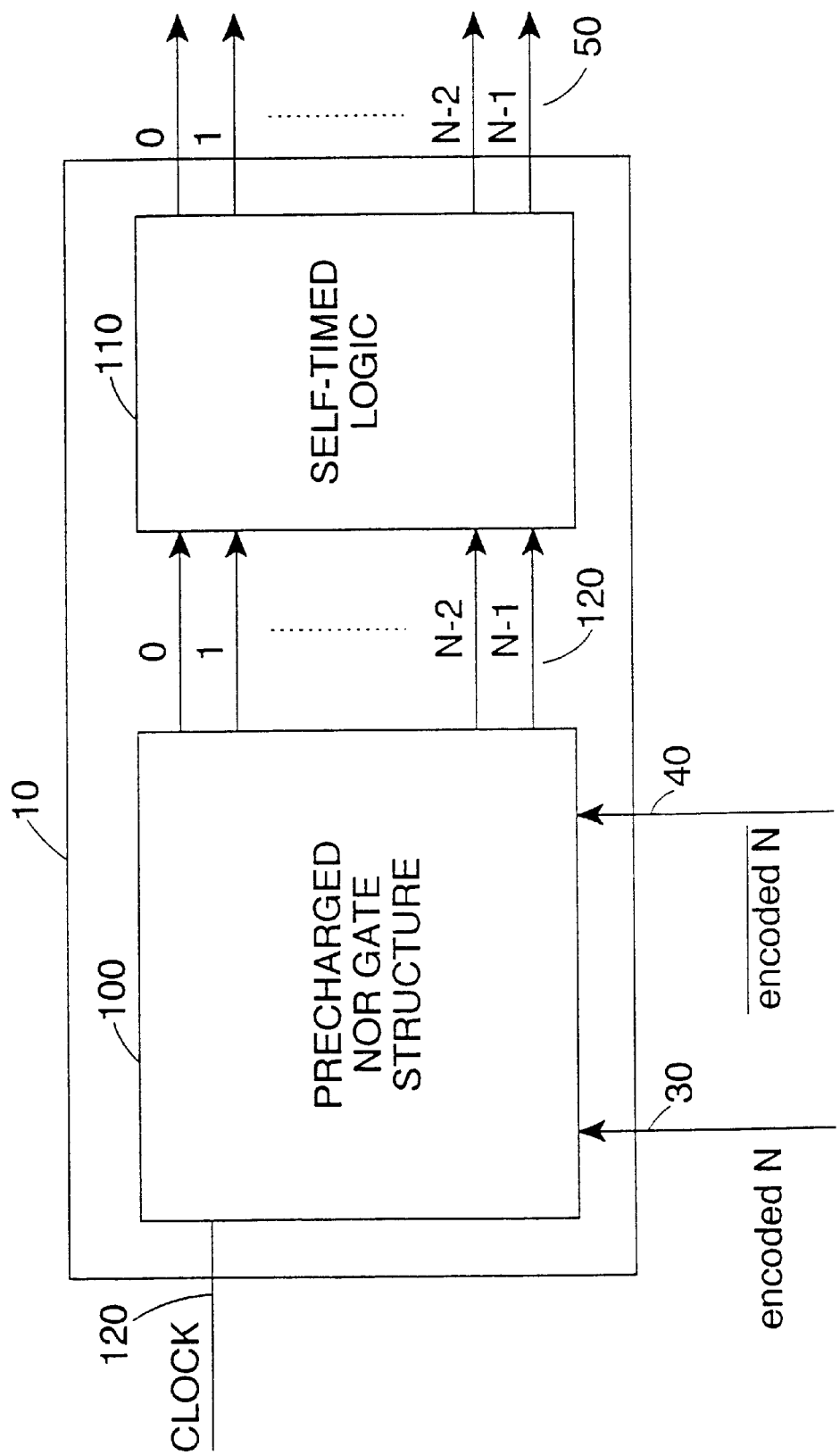
FIG. 2 is a block diagram illustrating in more detail the self-timed decoder of preferred embodiments of the present invention.

As shown in FIG. 2, the self-timed decoder 10 includes two basic elements. The first element is a precharged NOR gate structure 100 which is arranged to receive the encoded N-bit value and its complement over paths 30 and 40, respectively, and is also arranged to receive a clock signal over path 120.

The precharged NOR gate structure 100 is arranged to generate N intermediate signals 120 dependent on the values of the encoded N-bit input value and its complement. These N intermediate signals are then output to a second element of the self-timed decoder, namely self-timed logic 110. The self-timed logic 110 is arranged to generate N output signals from the corresponding N intermediate signals received as inputs. However, in accordance with preferred embodiments, each output signal is generated from the corresponding intermediate signal as qualified by a predetermined other intermediate signal. In preferred embodiments, during the precharge phase, the N intermediate signals output by the precharged NOR gate structure are at a logic 1 value, and the arrangement of the self-timed logic 110 is such that the corresponding output signals are all at a logic 0 value. In the evaluate phase following the precharge phase, the value of each intermediate signal is dependent on the encoded N-bit input value and its complement, but the precharged NOR gate structure 100 is arranged such that all but one of the intermediate signals will transition to a logic 0 value. The self-timed logic 0 110 is arranged such that in the evaluate phase the output signal corresponding to the intermediate signal that has remained at the logic 1 value transitions from the logic 0 value to the logic 1 value.

When generating an output signal from the corresponding intermediate signal, the purpose of qualifying the corresponding intermediate signal by a predetermined other intermediate signal is to ensure that all outputs from the self-timed decoder can be assumed to be valid after one of the output values has transitioned from a logic 0 value to a logic 1 value. This will be discussed in more detail later.

Figure 3:
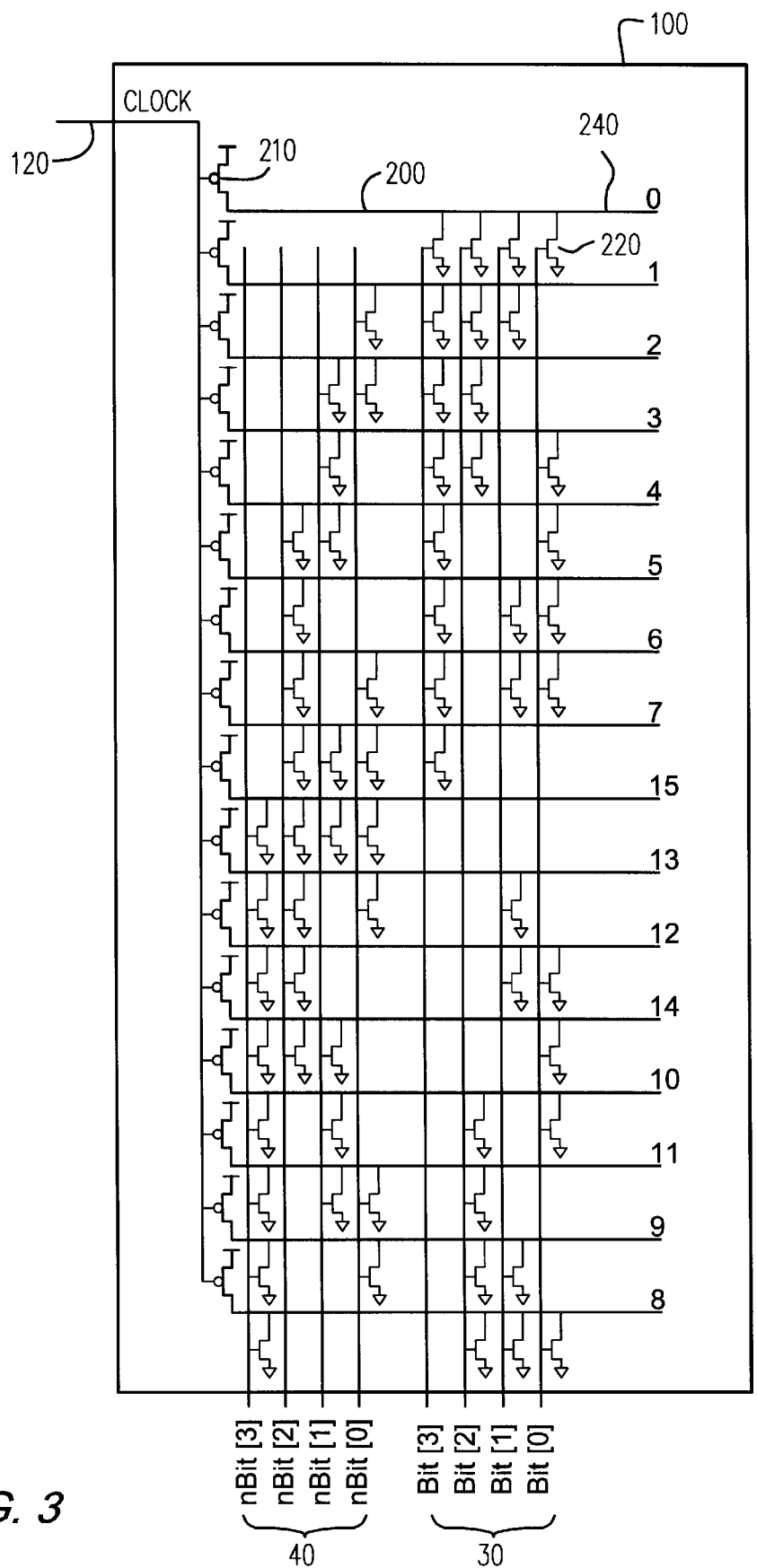
FIG. 3 is a diagram illustrating one way of arranging the gates within the precharged NOR gate structure of preferred embodiments.

FIG. 3 illustrates one particular arrangement of the precharged NOR gate structure 100, assuming that the input signals over paths 30 and 40 are an encoded 16-bit data value and its complement. It will be apparent that only 4 bits are required to encode a 16 bit data value and accordingly 4 bits are input over path 30 and 4 bits are input over path 40.

Each NOR gate consists of four n-type transistors connected in parallel, each of the n-type transistors gated by one of the bits from the two input signals. As illustrated in FIG. 3, sixteen NOR gates are provided, each producing an intermediate signal. Each of the NOR gates operate in an identical manner but are connected to different bits from the input signals. Considering the first NOR gate, this comprises four n-type transistors connected in parallel, generally referenced by the numeral 220 in FIG. 3. Each of these transistors is connected between a line 200 and ground, and the gate of each transistor is arranged to receive one bit of the input signals. Hence, with reference to FIG. 3, for the first NOR gate 220, each transistor receives a corresponding bit from the encoded input value passed over path 30.

A p-type pull-up transistor 210 is connected between a reference voltage and the line 200, and receives at its gate a clock signal passed over path 120. In the precharge phase, the clock signal is at a logic 0 level, this causing the p-type transistor to turn on, thus causing the voltage on line 200 to be "pulled up" to the reference voltage (i.e. logic 1 level). Typically, the input bits on paths 30 and 40 are returned to a logic zero value before the precharge phase. Hence a logic 1 value will be output over path 240 in the precharge phase.

During the evaluate phase, the clock signal is at a logic one level, thus turning the p-type transistor off. Hence, it will be appreciated that if any of the input bits connected to a transistor of the NOR gate 220 are at a logic 1 value, then this will cause the corresponding n-type transistor to conduct, thus discharging the line 200 from the reference voltage (a logic 1 value) to a logic 0 value. Thus a logic 0 value would be output over path 240.

The arrangement of the transistors making up the sixteen NOR gates illustrated in FIG. 3 are referred to as being "Gray code ordered". In accordance with this Gray code ordering, when the transistors making up a particular NOR gate are compared with the transistors making up an adjacent NOR gate, then all but one of the inputs are identical. A description of Gray code ordering can be found in the "Art of Electronic", 2nd Edition, by Horowitz and Hall (page 478). The numbers associated in FIG. 3 with each output path 240 indicate the bit of the decoded 16-bit data value represented by the intermediate signal output on that path.

However, it is not essential that the transistors are Gray code ordered, and all that is required is that the NOR gates are paired, such that for each pair, all but one of the transistors for each NOR gate receive the same inputs. The reason for this pairing will now be discussed with reference to FIG. 4, which shows a portion of the self-timed logic 110 arranged to handle the two intermediate signals generated by a pair o NOR gates of the precharged NOR gate structure 100.

Figure 4:
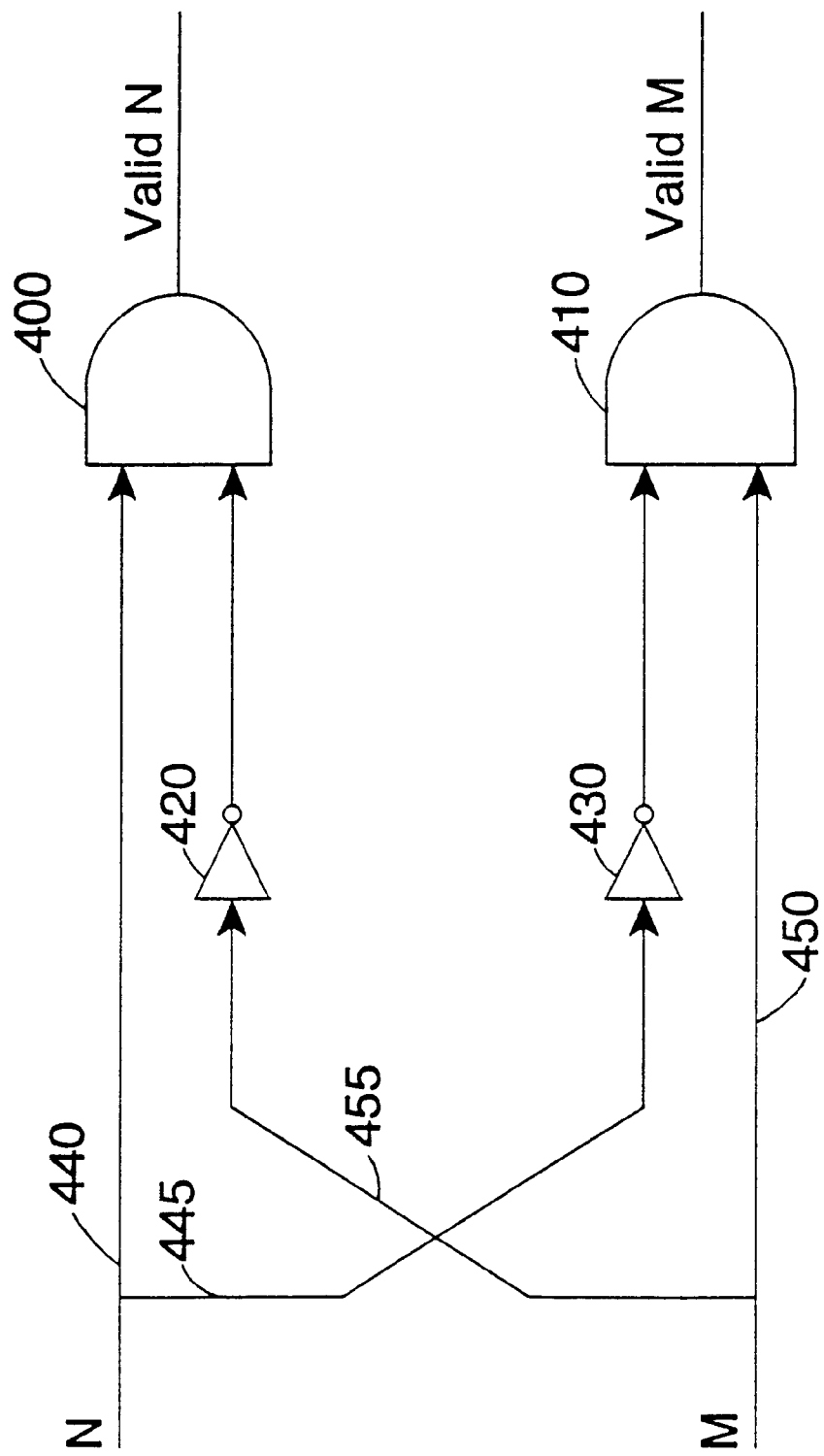
FIG. 4 illustrates a portion of the self-timed logic used to produce two output signals from a pair of intermediate signals generated by the precharged NOR gate structure.

As discussed earlier with reference to FIG. 3, during the precharge phase, the pull-up transistors 210 associated with each logical NOR gate pull the line 200 up to a reference voltage, and accordingly each NOR gate outputs an intermediate signal at a logic 1 value. For a particular pair of NOR gates, the portion of the self-timed logic illustrated in FIG. 4 will receive the corresponding logic 1 values as input values N and M, and these signals will be passed over paths 440 and 450 to one input of corresponding AND gates 400 and 410. Further, the logic 1 values will be passed over paths 445 and 455 to inverters 430 and 420, respectively. This will cause logic 0 values to be output by the inverters, and these logic 0 values will act as the second inputs to the AND gates 400 and 410. Accordingly, it will be seen that the signals output by the AND gates 400 and 410, which serve as the output signals of the decoder, will be at a logic 0 value during the precharge phase. The circuitry illustrated in FIG. 4 is replicated for each pair of NOR gates in the precharged NOR gate structure 100, and accordingly all output signals from the decoder 10 will be at a logic 0 value during the precharge phase.

In the evaluate phase, all but one of the intermediate signals will transition to a logic 0 value. Hence, for all but one of the pairs of NOR gates, the intermediate signals received as input signals N and M by the corresponding portion of the self-timed logic 110 will transition from a one to a zero. Accordingly it can be seen from FIG. 4 that the corresponding output signals of the decoder will remain at a logic 0 value since a logic 0 value will be supplied to the AND gates 400 and 410 over paths 440 and 450, respectively.

However, considering the pair of NOR gates that includes the NOR gate for which the intermediate signal remains at the logic 1 value, it can be seen that one of the inputs N, M to the corresponding portion of the self-timed logic will be at a logic 1 value, whilst the other input will be at a logic 0 value. Assuming the input N receives a logic 1 value, and the input M receives a logic 0 value, it can be seen that the AND gate 400 will now receive a logic 1 value over path 440, whilst the AND gate 450 will receive a logic 0 value over path 450. Since the input N is at a logic 1 value, and was at a logic 1 value during the precharge phase, the signal over path 445 remains unchanged, and accordingly the output of the inverter 430 remains unchanged, i.e. is at a logic 0 value. Accordingly, the output from the AND gate 410 remains at a logic 0 value.

However, the signal over path 455 now changes from a logic 1 value (in the precharge phase) to a logic 0 value (in the evaluate phase). This will cause the output of the inverter 420 to change to a logic 1 value after a predetermined delay resulting from the processing performed by the inverter 420. After this delay, it is clear that both inputs to the AND gate 400 will be at a logic 1 value, and accordingly the output from the AND gate 400 will be a logic 1 value. Accordingly, it can be seen that during the evaluate phase, exactly one of the output signals transitions from the logic 0 to the logic 1 value, and all remaining output signals remain at the logic 0 value.

As mentioned previously, the delay introduced by the inverter 420 is designed exceed by a predetermined safety margin the maximum time difference between either one of the two NOR gates in the pair transitioning from a logic 1 value to a logic 0 value, which in preferred embodiments is the time difference between one transistor pulling down and two transistors pulling down. Hence, the predetermined delay introduced by the inverter 420 ensures that by the time the inverter 420 outputs a logic 1 value, then if there is still a logic 1 value on path 440, then that logic 1 value can be presumed to be valid, and accordingly can be output by the AND gate 400.

Accordingly, it can be seen that the decoder in accordance with preferred embodiments of the present invention enables the benefits of using a NOR gate structure to be achieved, whilst enabling the decoder to exhibit the behaviour that at the start of the evaluate phase, all outputs of the decoder are 0, and that during the evaluate phase, exactly one output makes a single transition from 0 to 1. Further, due to the arrangement of the self-timed logic 110, the decoder is self-timed, so that by the time a logic 1 value is output by the decoder, that logic 1 value can be presumed to be valid, and accordingly all of the outputs of the decoder can be considered to be valid.

It will be appreciated that the use of a dedicated self-timed path would not be practical in such a decoder, because there is no single input that is guaranteed to make a transition in every evaluate phase which could be used as a trigger for the self-timed path. This problem is alleviated in preferred embodiments by use of the self-timed logic as illustrated in FIG. 4.

As an alternative to the FIG. 4 embodiment, the inverters 420, 430 may be replaced by NOR gates to facilitate further gating of the signals prior to them being output by the AND gates 400, 410. For example, a suitable clock signal may be used as the other input for each NOR gate in addition to the signals passed over paths 455 and 445, respectively. By taking such an approach, it will be appreciated that it may be possible in certain implementations to reduce the complexity of the domino logic 20 arranged to receive the output signals from the self-timed decoder 10.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A decoder for generating N output signals, the decoder comprising:

a precharged gate structure arranged to receive two or more input signals and to generate N intermediate signals, in a precharge phase said precharged gate structure being arranged to output said N intermediate signals at a first logic value, and in an evaluate phase said precharged gate structure being arranged to maintain a first intermediate signal at said first logic value, and to cause all other intermediate signals to transition to a second logic value;

self-timed logic for receiving the N intermediate signals, and for generating said N output signals, the self-timed logic being arranged, during said precharge phase, to generate said N output signals at said second logic value, and during said evaluate phase to cause a first output signal corresponding to said first intermediate signal to transition to said first logic value;

said self-timed logic being arranged to generate each output signal from the corresponding intermediate signal as qualified by a predetermined other intermediate signal, such that the transition of said first output signal to said first logic value is delayed by a first predetermined time after the predetermined other intermediate signal has transitioned to said second logic value.

2. A decoder for generating N output signals, the decoder comprising:

a precharged gate structure arranged to receive two or more input signals and to generate N intermediate signals, in a precharge phase said precharged gate structure being arranged to output said N intermediate signals at a first logic value, and in an evaluate phase said precharged gate structure being arranged to maintain a first intermediate signal at said first logic value, and to cause all other intermediate signals to transition to a second logic value;

self-timed logic for receiving the N intermediate signals, and for generating said N output signals, the self-timed logic being arranged, during said precharge phase, to generate said N output signals at said second logic value, and during said evaluate phase to cause a first output signal corresponding to said first intermediate signal to transition to said first logic value;

said self-timed logic being arranged to generate each output signal from the corresponding intermediate signal as qualified by a predetermined other intermediate signal, such that the transition of said first output signal to said first logic value is delayed by a first predetermined time after the predetermined other intermediate signal has transitioned to said second logic value, wherein the self-timed logic comprises a logical AND gate for each intermediate signal, each logical AND gate being arranged to receive the corresponding intermediate signal and a second signal derived by inverting the predetermined other intermediate signal.

3. A decoder as claimed in claim 2, wherein the self-timed logic comprises an inverter associated with each AND gate, the inverter being arranged to receive at its input the predetermined other intermediate signal, and to generate at its output the second signal for inputting to the associated AND gate.

4. A decoder as claimed in claim 3, wherein said inverter takes said first predetermined time to generate the second signal from the predetermined other intermediate signal received at its input.

5. A decoder for generating N output signals, the decoder comprising:

a precharged gate structure arranged to receive two or more input signals and to generate N intermediate signals, in a precharge phase said precharged gate structure being arranged to output said N intermediate signals at a first logic value, and in an evaluate phase said precharged gate structure being arranged to maintain a first intermediate signal at said first logic value, and to cause all other intermediate signals to transition to a second logic value;

self-timed logic for receiving the N intermediate signals, and for generating said N output signals, the self-timed logic being arranged, during said precharge phase, to generate said N output signals at said second logic value, and during said evaluate phase to cause a first output signal corresponding to said first intermediate signal to transition to said first logic value;

said self-timed logic being arranged to generate each output signal from the corresponding intermediate signal as qualified by a predetermined other intermediate signal, such that the transition of said first output signal to said first logic value is delayed by a first predetermined time after the predetermined other intermediate signal has transitioned to said second logic value, wherein said precharged gate structure comprises a plurality of logical NOR gates.

6. A decoder as claimed in claim 5, wherein in said evaluate phase, the precharged gate structure is arranged to receive a first input signal comprising an encoded N-bit value, and a second input signal comprising the complement of the first input signal, selected bits of the first and second input signals being provided to the plurality of logical NOR gates in order to generate said N intermediate signals.

7. A decoder as claimed in claim 5, wherein the logical NOR gates are grouped it pairs, and the logical NOR gates in each pair are arranged so that the maximum time difference between the intermediate signals generated by each logical NOR gate transitioning from said first logic value to said second logic value is a second predetermined time, the first predetermined time being at least as long as the second predetermined time.

8. A method of generating N output signals from two or more input signals, the method comprising the steps of:

(i) inputting the two or more input signals to a precharged gate structure;

(ii) arranging the precharged gate structure to generate N intermediate signals, in a precharge phase said precharged gate structure outputting said N intermediate signals at a first logic value, and in an evaluate phase said precharged gate structure maintaining a first intermediate signal at said first logic value, and causing all other intermediate signals to transition to a second logic value;

(iii) passing the N intermediate signals to self-timed logic arranged to generate said N output signals;

(iv) arranging the self-timed logic to generate, during said precharge phase, said N output signals at said second logic value, and during said evaluate phase to cause a first output signal corresponding to said first intermediate signal to transition to said first logic value;

said self-timed logic being arranged to generate each output signal from the corresponding intermediate signal as qualified by a predetermined other intermediate signal, such that the transition of said first output signal to said first logic value is delayed by a first predetermined time after the predetermined other intermediate signal has transitioned to said second logic value.

* * * * *